United States Patent
Khouqeer et al.

(10) Patent No.: US 12,243,928 B1
(45) Date of Patent: Mar. 4, 2025

(54) P-GAN HIGH ELECTRON MOBILITY TRANSISTOR (HEMT) WITH MOS2-BASED 2D BARRIER

(71) Applicant: IMAM MOHAMMAD IBN SAUD ISLAMIC UNIVERSITY, Riyadh (SA)

(72) Inventors: Ghada A. Khouqeer, Riyadh (SA); Arihant Raj Siddarth, Riyadh (SA); Gaurav Jayaswal, Riyadh (SA); Rahul Sharma, Riyadh (SA); Yogita Sharma, Riyadh (SA); Priya Kaushal, Riyadh (SA); Gargi Khanna, Riyadh (SA); Tahani A. Alrebdi, Riyadh (SA); Abdullah N. Alodhayb, Riyadh (SA)

(73) Assignee: IMAM MOHAMMAD IBN SAUD ISLAMIC UNIVERSITY, Riyadh (SA)

( * ) Notice: Subject to any disclaimer, the term of this patent is extended or adjusted under 35 U.S.C. 154(b) by 0 days.

(21) Appl. No.: 18/916,467

(22) Filed: Oct. 15, 2024

(51) Int. Cl.
| | |
|---|---|
| *H01L 29/778* | (2006.01) |
| *H01L 21/285* | (2006.01) |
| *H01L 29/20* | (2006.01) |
| *H01L 29/47* | (2006.01) |
| *H01L 29/66* | (2006.01) |

(52) U.S. Cl.
CPC ...... *H01L 29/475* (2013.01); *H01L 21/28581* (2013.01); *H01L 29/2003* (2013.01); *H01L 29/66462* (2013.01); *H01L 29/7786* (2013.01)

(58) Field of Classification Search
None
See application file for complete search history.

(56) References Cited

U.S. PATENT DOCUMENTS

| | | |
|---|---|---|
| 2007/0164313 A1 | 7/2007 | Hoke et al. |
| 2016/0322225 A1 | 11/2016 | Chen et al. |
| 2022/0404204 A1 | 12/2022 | Hanus et al. |
| 2024/0194774 A1 | 6/2024 | Tseng et al. |

FOREIGN PATENT DOCUMENTS

| | | |
|---|---|---|
| CN | 114038912 A | 2/2022 |

OTHER PUBLICATIONS

Priya Kaushal, et al, "The Role of 2-Dimensional Materials for Electronic Devices", Materials Science in Semiconductor Processing, vol. 143, Jun. 1, 2022, 106546, pp. 1-8.

Xiaosong Han, et al., "A Mini Review:: Phase Regulation for Molybdenum Dichalcogenide Nanomaterials", Nanomaterials (Basel) Jun. 2024; 14(11):984, pp. 1-20.

*Primary Examiner* — Grant S Withers
(74) *Attorney, Agent, or Firm* — Oblon, McClelland, Maier & Neustadt, L.L.P.

(57) ABSTRACT

A bandgap tuneable p-GaN high electron mobility transistor (HEMT) having a structure stacked on a silicon carbide substrate. The device incorporates an indium nitride nucleation layer, followed by an aluminum nitride nucleation layer, and a first aluminum gallium nitride buffer layer. A gallium nitride channel layer is deposited on this stack, with an aluminum source and a drain contact at either end. The bandgap tuneable p-GaN HEMT includes a two-dimensional molybdenum disulfide layer over the channel, covered by a second AlGaN buffer layer. A p-type gallium nitride cap layer and a platinum gate contact complete the structure. This configuration facilitates bandgap tuning and strain engineering, enhancing electron mobility and density in the two-dimensional electron gas region, making it suitable for high-power and high-frequency applications.

20 Claims, 5 Drawing Sheets

P-GAN HIGH ELECTRON MOBILITY TRANSISTOR (HEMT) WITH MOS2-BASED 2D BARRIER

BACKGROUND

Technical Field

The present disclosure is directed to the field of semiconductor devices, and more particularly to high electron mobility transistors (HEMTs) utilizing wide bandgap materials and two-dimensional (2D) materials for enhanced performance in power electronics and high-frequency applications.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Transistors are the heart of modern microelectronics. In particular, NPN transistors and metal oxide semiconductor field effect transistors (MOSFETs) are the main constituents of microelectronic devices and are able to generate currents of extremely low magnitudes (~pA). The field of microelectronic devices has seen rapid growth in recent decades, in conjunction with the ever-increasing demand for higher performance, greater efficiency, and improved functionality in electronic systems. While innovations in power MOSFET structures, technology, and circuit topologies have kept pace with the growing need for electrical power, the rate of improvement has slowed down as silicon power MOSFETs have asymptotically begun approaching the theoretical bounds [See: Ratnesh, R. K., Goel, A., Kaushik, G., Garg, H., Singh, M., & Prasad, B. (2021). Advancement and challenges in MOSFET scaling. *Materials Science in Semiconductor Processing,* 134, 106002]. Among the various semiconductor technologies, high electron mobility transistors (HEMTs) have emerged as critical components in high-frequency and high-power applications. HEMTs, also known as heterostructure field-effect transistors (HFETs), utilize the principle of quantum confinement to achieve high electron mobility compared to conventional transistor structures. This technology has found widespread use in areas such as wireless communications, radar systems, and power electronics, where high-speed switching and efficient power handling are important.

Despite the significant progress made in HEMT technology, several challenges persist in meeting the evolving requirements of modern electronic systems. One of the primary issues is the limitation in electron mobility and density within the 2DEG region of the HEMT structure. This limitation directly impacts its current-carrying capacity and switching speed, which are important parameters for high-performance applications. Additionally, as the demand for higher power density increases, managing heat dissipation and maintaining device reliability under extreme operating conditions have become increasingly challenging. Furthermore, the ability to precisely control the electrical characteristics of HEMTs, such as threshold voltage and transconductance, remains a significant hurdle in optimizing device performance for specific applications.

Gallium nitrate (GaN) based HEMTs on silicon (Si) configuration has been employed to realize a low switching loss, cost-effective, and high-power device solution. GaN-HEMTs have serval advantages over Si-transistor. The large bandgap permits the devices to operate at higher switching speeds and at higher temperatures. Moreover, and due to their wide band-gap nature, GaN-HEMTs possess higher breakdown voltages. The first GaN-HEMT device was fabricated by Eudyna Corporation in 2004 [See: Liu, A. C., Tu, P. T., Langpoklakpam, C., Huang, Y. W., Chang, Y. T., Tzou, A. J., . . . & Chang, E. Y. (2021). The evolution of manufacturing technology for GaN electronic devices. *Micromachines,* 12(7), 737], with interest garnered due to its unique properties. GaN is a wide band gap semiconductor when compared to its conventional counterpart, i.e., Si. Given this wide band gap, GaN possesses a high breakdown electric field, high saturation velocity and good thermal conductivity. These special electric properties provide for GaN devices to be used in extreme environments and at high temperatures and pressures. HEMT includes a 2-dimensional electron gas (2DEG) confined at the heterojunction of epitaxial layers, between a group III-nitride such as GaN and its alloy AlGaN. Due to their excellent thermal stability and electronic attributes, these heterojunction material compositions have made it possible to manufacture high-power devices. Another significant property of the GaN/AlGaN interface is the presence of polarization of which reduces the scattering of charges to bulk or any dopant, since the charges are confined to one plane only and cannot move in the z-direction. If stress is applied to GaN, then a change in the spontaneous polarization is seen, and if this change is brought to a good extent by applying more stress, then another polarization vector known as piezoelectric polarization is formed; this is the main driving force behind the working of AlGaN/GaN devices. This polarization takes place when AlGaN is doped with n-type material and a plurality of electrons are present in the conduction band.

While the use of wide bandgap materials like GaN has significantly improved power handling and high-frequency performance, challenges remain in fully optimizing the 2DEG characteristics and achieving precise control over the device's electrical properties. The conventional heterostructure designs, typically employing III-V compound semiconductors, have inherent constraints in terms of lattice matching and band alignment, which limit the degree of performance enhancement that can be achieved. Moreover, current approaches to improving device control and reliability often involve complex fabrication processes or structural modifications that can negatively impact other aspects of device performance or increase manufacturing costs.

Recent developments in HEMT technology have explored some structural modifications and material combinations to address these issues. Some approaches have focused on incorporating new materials into the HEMT structure while other approaches have focused on changing structural configuration of the HEMT, with aim to enhance its performance characteristics, but have achieved limited success.

US20240194774A1 describes an HEMT stack incorporating a two-dimensional layer of $MoS_2$ between the source and drain contacts. While this structural configuration provides potential improvements in electron mobility, it does not address all the challenges associated with optimizing HEMT performance across various applications.

US20160322225A1 describes a tri-nitride (III-N) HEMT device with multiple III-N seed layers and a doped compound layer. This configuration aims to improve the crystal quality and device control, but it may not fully address a need for enhanced electron mobility and precise bandgap engineering.

CN114038912A describes a HEMT device utilizing a molybdenum disulfide (MoS$_2$) covering layer in place of traditional p-type gallium nitride or nickel oxide layers. While this configuration helps in improving certain device characteristics, it may not provide a comprehensive solution to the challenges of optimizing both power handling and high-frequency performance.

Each of the aforementioned references suffers from one or more drawbacks hindering their adoption, such as limited control over bandgap engineering, insufficient enhancement of electron mobility, or inadequate integration of multiple performance-enhancing features. These limitations result in suboptimal device performance across the full spectrum of desired characteristics, including power handling, high-frequency operation, and precise electrical control.

Accordingly, it is one object of the present disclosure to provide a bandgap tuneable p-GaN HEMT and a method of making a bandgap tuneable p-GaN HEMT, which enhances electron mobility and density in the 2DEG region while simultaneously providing precise bandgap tuning. The present disclosure achieves this through a combination of materials and layer structures that synergistically improve multiple aspects of device performance for advanced electronic systems across various industries.

SUMMARY

In an exemplary embodiment, a bandgap tuneable p-GaN high electron mobility transistor (HEMT) is described, comprising: a silicon carbide (SiC) substrate; an indium nitride (InN) nucleation layer deposited on the SiC substrate, wherein the InN nucleation layer has a thickness of about 5 nanometers; an aluminum nitride (AlN) nucleation layer grown on the InN nucleation layer, wherein the AlN nucleation layer has a thickness of about 5 nanometers; a first aluminum gallium nitride (AlGaN) buffer layer located on the AlN nucleation layer; a gallium nitride (GaN) channel layer located on the first AlGaN buffer layer; an aluminum source contact located over a first end of the GaN channel layer; an aluminum drain contact located over a second end of the GaN channel layer; a two dimensional molybdenum disulfide (MoS$_2$) layer located over the GaN channel layer between the aluminum source contact and the aluminum drain contact, wherein the two dimensional MoS$_2$ layer has a thickness of about 2 nanometers; a second aluminum gallium nitride (AlGaN) buffer layer located over the two dimensional MoS$_2$ layer between the aluminum source contact and the aluminum drain contact; a p-type gallium nitride cap layer located on the second AlGaN buffer layer at a distance of about 1 micron from the aluminum source contact and about 6 microns from the aluminum drain contact; and a platinum gate contact located on the p-type gallium nitride cap layer.

In another exemplary embodiment, a method of making a bandgap tuneable p-GaN high electron mobility transistor (HEMT) is described, comprising: growing a silicon carbide (SiC) substrate layer to a thickness of about 1.99 microns; depositing, by DC reactive magnetron sputtering, an indium nitride (InN) nucleation layer on the SiC substrate to a thickness of about 5 nanometers; growing, by chemical vapor deposition, an aluminum nitride (AlN) nucleation layer on the InN nucleation layer to a thickness of about 5 nanometers; depositing a first aluminum gallium nitride (AlGaN) buffer layer on the AlN nucleation layer to a thickness of about 2.64 microns, wherein the first AlGaN layer has an aluminum composition of about 51%; depositing a gallium nitride (GaN) channel layer on the first AlGaN buffer layer to a thickness of about 34 nanometers; depositing an aluminum source contact over a first end of the GaN channel layer, wherein the aluminum source contact is configured to have a length of about 1 micron; depositing an aluminum drain contact over a second end of the GaN channel layer, wherein the aluminum drain contact is configured to have a length of about 1 micron; depositing a two dimensional molybdenum disulfide (MoS$_2$) layer over the GaN channel layer between the aluminum source contact and the aluminum drain contact to a thickness of about 2 nanometers, and configuring a length of the two dimensional MoS$_2$ layer to be about 0.65 microns; depositing a second AlGaN buffer layer located over the two dimensional MoS$_2$ layer between the aluminum source contact and the aluminum drain contact, wherein the second AlGaN buffer layer is configured to have a length of about 0.65 microns and a thickness of about 14.7 nanometers; depositing a p-type gallium nitride cap layer on the second AlGaN buffer layer at a distance of about 1 micron from the aluminum source contact and about 6 microns from the aluminum drain contact, wherein the p-type gallium nitride cap layer is configured to have a length of about 1.4 microns and a thickness of about 60 nanometers; doping the p-type gallium nitride cap layer to a doping concentration of $10^{16}/cm^3$; and depositing a platinum gate contact on the p-type gallium nitride cap layer.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

In the drawings, like reference numerals designate identical or corresponding parts throughout the several views. Further, as used herein, the words "a", "an" and the like generally carry a meaning of "one or more", unless stated otherwise.

Furthermore, the terms "approximately," "approximate", "about" and similar terms generally refer to ranges that include the identified value within a margin of 20%, 10%, or preferably 5%, and any values therebetween.

Aspects of this disclosure are directed to a bandgap tuneable p-GaN high electron mobility transistor (HEMT) and a method of making thereof. The bandgap tuneable p-GaN HEMT of the present disclosure integrates a combination of nucleation layers, buffer layers, and a two-dimensional material interface to enhance electron mobility, improve power handling capabilities, and support precise control over its electrical properties. The HEMT design of the present disclosure addresses the limitations of conventional HEMTs by providing a means to tune the bandgap and optimize the two-dimensional electron gas (2DEG) region, resulting in a device with enhanced efficiency and versatility across a wide range of operating conditions. The HEMT of the present disclosure contributes to the development of next-generation power electronics and high-frequency applications, offering potential advancements in fields such as wireless communications, radar systems, and energy conversion technologies.

Figure 1:
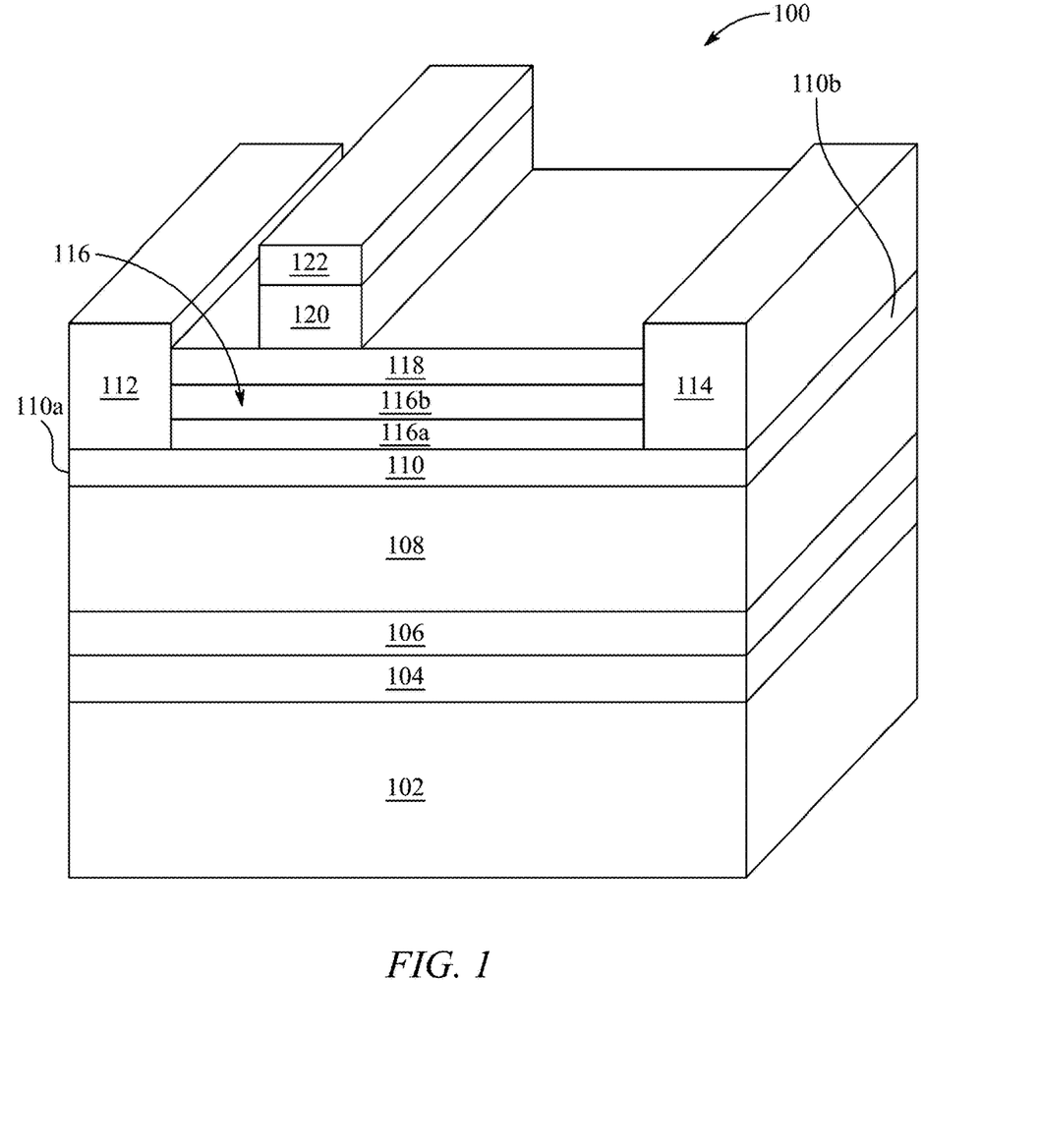
FIG. 1 is an exemplary three-dimensional cross-sectional diagram of a bandgap tuneable p-GaN high electron mobility transistor (HEMT), according to certain embodiments.

Referring to FIG. 1, illustrated is a three-dimensional (3D) cross-sectional view of a bandgap tuneable p-GaN high electron mobility transistor (HEMT) (as represented by reference numeral 100). The bandgap tuneable p-GaN HEMT 100 is a semiconductor device designed for high-frequency and high-power applications. The bandgap tuneable p-GaN HEMT 100 of the present disclosure has a layered structure that incorporates various materials to enhance electron mobility and facilitate precise control over electrical characteristics. The bandgap tuneable p-GaN HEMT 100 utilizes a combination of wide bandgap materials and a two-dimensional material interface to achieve superior electrical properties. Further, the bandgap tuneable p-GaN HEMT 100 incorporates multiple buffer layers and nucleation layers to manage strain and promote high-quality crystal growth throughout the device structure. The overall configuration of the bandgap tuneable p-GaN HEMT 100 is designed to achieve high electron mobility, improved power handling capabilities, and enhanced control over threshold voltage and transconductance, making it suitable for use in various applications including wireless communications, radar systems, and power electronics where high-speed switching and efficient power handling are required.

As illustrated, the bandgap tuneable p-GaN HEMT 100 includes a silicon carbide (SiC) substrate 102. The SiC substrate 102 serves as the foundation for the device structure onto which the bandgap tuneable p-GaN HEMT 100 is built on. It may be contemplated that GaN can be grown on different types of substrates such as sapphire or silicone. Silicon is relatively less expensive, but the quality of the crystal obtained is of poor quality and is characterized by limited performance. On the other hand, SiC as the substrate has excellent thermal conductivity and the quality of GaN crystals grown upon it are of high quality. In an aspect, the SiC substrate 102 has a thickness of about 1.99 microns. This specific thickness of the SiC substrate 102 provides a foundation for the device while balancing factors such as thermal management and overall device dimensions. The SiC substrate 102, with its thickness of about 1.99 microns, provides high thermal conductivity, which facilitates dissipating heat generated during high-power operation of the bandgap tuneable p-GaN HEMT 100.

The bandgap tuneable p-GaN HEMT 100 further includes an indium nitride (InN) nucleation layer 104 deposited on the SiC substrate 102. The InN nucleation layer 104 has a thickness of about 5 nanometers. The InN nucleation layer 104 serves as an initial growth surface for subsequent layers and helps to reduce lattice mismatch between the SiC substrate 102 and the overlying layers. The use of InN as a nucleation layer contributes to improved crystal quality in the device structure. In an aspect, the InN nucleation layer 104 is deposited on the SiC substrate 102 using DC reactive magnetron sputtering. DC reactive magnetron sputtering facilitates the growth of the InN nucleation layer 104 at relatively low temperatures, which helps in maintaining the integrity of the SiC substrate 102. This deposition technique produces high-quality, thin InN layers with precise thickness control. The bandgap tuneable p-GaN HEMT 100 further includes an aluminum nitride (AlN) nucleation layer 106 grown on the InN nucleation layer 104. The AlN nucleation layer 106 is grown on top of the InN nucleation layer 104. The AlN nucleation layer 106 also has a thickness of about 5 nanometers. The AlN nucleation layer 106 further enhances the crystal quality of the subsequent layers and provides additional strain management in the device structure. In an aspect, the AlN nucleation layer 106 is grown on the InN nucleation layer 104 by chemical vapor deposition (CVD). CVD facilitates growth of high-quality, uniform AlN films with excellent control over composition and thickness. Further, the use of CVD for growing the AlN nucleation layer 106 ensures good adhesion to the InN nucleation layer 104 and promotes the formation of a high-quality crystal structure in the subsequent layers of the bandgap tuneable p-GaN HEMT 100. The combination of the InN nucleation layer 104 and the AlN nucleation layer 106 forms a dual nucleation layer system that promotes high-quality epitaxial growth of the subsequent layers. This system provides better control over the crystal growth process and contributes to the overall performance enhancement of the bandgap tuneable p-GaN HEMT 100.

The bandgap tuneable p-GaN HEMT 100 further includes a first aluminum gallium nitride (AlGaN) buffer layer 108 located on the AlN nucleation layer 106. The first AlGaN buffer layer 108 serves multiple purposes in the device structure. The first AlGaN buffer layer 108 helps to manage strain in the bandgap tuneable p-GaN HEMT 100, reduces defects propagating from the substrate, and provides a smooth surface for the subsequent layers. In an aspect, the first AlGaN buffer layer 108 has a thickness of about 2.64 microns and an aluminum composition of about 51%. These specifications of the first AlGaN buffer layer 108 facilitate strain management in the device structure and provide a suitable platform for the formation of the two-dimensional electron gas (2DEG). The high aluminum content the first AlGaN buffer layer 108 contributes to the formation of a strong polarization field, which also helps with the creation of the 2DEG in the device structure.

It may be understood that, as used herein, 2DEG is a scientific model in solid-state physics. It is an electron gas that is free to move in two dimensions, but tightly confined in the third. This tight confinement leads to quantized energy levels for motion in the third direction, which can then be ignored for most problems. Thus, the electrons appear to be a 2D sheet embedded in a 3D world. Most 2DEGs are found in transistor-like structures made from semiconductors. The most commonly encountered 2DEG is the layer of electrons found in MOSFETs (metal-oxide-semiconductor field-effect transistors). When the transistor is in inversion mode, the electrons underneath the gate oxide are confined to the semiconductor-oxide interface, and thus occupy well defined energy levels. For thin-enough potential wells and temperatures which are not too high, only the lowest level is occupied, and so the motion of the electrons perpendicular to the interface can be ignored. However, the electron is free to move parallel to the interface, and so is quasi-two-dimensional. Other methods for engineering 2DEGs are HEMTs (as used in aspects of the present disclosure) and rectangular quantum wells. HEMTs are field-effect transistors that utilize the heterojunction between two semiconducting materials to confine electrons to a triangular quantum well. Electrons confined to the heterojunction of HEMTs exhibit higher mobilities than those in MOSFETs, since the former device utilizes an intentionally undoped channel thereby mitigating the deleterious effect of ionized impurity scattering. Two closely spaced heterojunction interfaces may be used to confine electrons to a rectangular quantum well.

The bandgap tuneable p-GaN HEMT 100 further includes a gallium nitride (GaN) channel layer 110 located on the first AlGaN buffer layer 108. The GaN channel layer 110 is where the 2DEG forms, facilitating high electron mobility. The GaN channel layer 110 is typically undoped, and the 2DEG is formed at the interface between the GaN channel layer 110 and the overlying layers due to spontaneous and piezoelectric polarization effects. In an aspect, the GaN channel layer 110 has a thickness of about 34 nanometers. This specific thickness of the GaN channel layer 110 is chosen to ensure efficient confinement of the 2DEG while maintaining high electron mobility. The specified thickness of the GaN channel layer 110 represents a balance between these factors, contributing to the high-performance characteristics of the bandgap tuneable p-GaN HEMT 100.

The bandgap tuneable p-GaN HEMT 100 further includes an aluminum source contact 112 located over a first end 110a of the GaN channel layer 110. The aluminum source contact 112 serves as a source terminal of the bandgap tuneable p-GaN HEMT 100, providing a path for current flow into the device. The use of aluminum for the aluminum source contact 112 ensures good electrical conductivity and forms an ohmic contact with the GaN channel layer 110. In an aspect, the aluminum source contact 112 has a length of about 1 micron. This specific length of the aluminum source contact 112 is designed to provide sufficient area for current flow, while minimizing contact resistance and overall device footprint. The bandgap tuneable p-GaN HEMT 100 also includes an aluminum drain contact 114 located over a second end 110b of the GaN channel layer 110. The aluminum drain contact 114 serves as an output terminal of the device, facilitating current to flow out of the bandgap tuneable p-GaN HEMT 100. Similar to the aluminum source contact 112, the use of aluminum for the aluminum drain contact 114 ensures good electrical conductivity and forms an ohmic contact with the GaN channel layer 110. In an aspect, the aluminum drain contact 114 also has a length of about 1 micron, matching the dimensions of the aluminum source contact 112. This symmetry in the dimensions of the aluminum source contact 112 and the aluminum drain contact 114 helps to ensure balanced electrical characteristics in the bandgap tuneable p-GaN HEMT 100.

The bandgap tuneable p-GaN HEMT 100 further includes a two dimensional molybdenum disulfide ($MoS_2$) layer 116 located over the GaN channel layer 110 between the aluminum source contact 112 and the aluminum drain contact 114. The two dimensional $MoS_2$ layer 116 introduces unique properties that enhance the performance of the bandgap tuneable p-GaN HEMT 100. In present configuration, the two dimensional $MoS_2$ layer 116 has a length of about 0.65 microns and is disposed between the aluminum source contact 112 and the aluminum drain contact 114. Further, herein, the two dimensional $MoS_2$ layer 116 has a thickness of about 2 nanometers. In an aspect, the two dimensional $MoS_2$ layer 116 includes a first $MoS_2$ layer 116a having a thickness of about 1 nanometer and a second $MoS_2$ layer 116b having a thickness of about 1 nanometer. This bi-layer structure of the two dimensional $MoS_2$ layer 116 provides better control over the electrical properties of the bandgap tuneable p-GaN HEMT 100. Specifically, the use of two separate monolayers instead of a single bilayer enhances the tunability of the electrical properties of the bandgap tuneable p-GaN HEMT 100.

In an aspect of the present disclosure, the two dimensional $MoS_2$ layer 116 is configured to increase the bandgap under compressive strain and to decrease the bandgap under tensile strain. This strain-dependent bandgap modulation is a characteristic of the two dimensional $MoS_2$ layer 116 that provides the tunability feature of the bandgap tuneable p-GaN HEMT 100. When the two dimensional $MoS_2$ layer 116 is under compressive strain, the bandgap of the material increases, potentially leading to changes in the electrical characteristics of the bandgap tuneable p-GaN HEMT 100. Conversely, when the two dimensional $MoS_2$ layer 116 is under tensile strain, the bandgap decreases, which can result in different device behavior.

In general, the incorporation of the two dimensional $MoS_2$ layer 116 in the bandgap tuneable p-GaN HEMT 100 provides several advantages. The two dimensional $MoS_2$ layer 116 increases the electron mobility in the 2DEG region of the device, as attributed to the high carrier mobility in the $MoS_2$ monolayers, which complements the already high electron mobility in the GaN channel layer 110.

The strain-dependent bandgap modulation of the two dimensional $MoS_2$ layer 116 facilitates tuning of the bandgap and strain in the bandgap tuneable p-GaN HEMT 100. Such tunability permits adjusting of the characteristics of the bandgap tuneable p-GaN HEMT 100 for a wide range of applications (as required).

The bandgap tuneable p-GaN HEMT 100 further includes a second aluminum gallium nitride (AlGaN) buffer layer 118 located over the two dimensional $MoS_2$ layer 116 between the aluminum source contact 112 and the aluminum drain contact 114. The second AlGaN buffer layer 118 works in conjunction with the two dimensional $MoS_2$ layer 116 to enhance the control over the 2DEG in the GaN channel layer 110. The presence of the second AlGaN buffer layer 118 helps to create a strong confinement potential for the 2DEG, as required for achieving high electron mobility in the bandgap tuneable p-GaN HEMT 100. In an aspect, the second AlGaN buffer layer 118 has a length of about 0.65 microns and a thickness of about 14.7 nanometers. The specified length of the second AlGaN buffer layer 118 matches the length of the two dimensional $MoS_2$ layer 116, which ensures uniform coverage and interaction between these two layers across the active region of the bandgap tuneable p-GaN HEMT 100. The thickness of about 14.7 nanometers of the second AlGaN buffer layer 118 is chosen to balance the strain in the device structure while maintaining the desired band alignment for the bandgap tuneable p-GaN HEMT 100. This thin layer provides effective coupling between the two dimensional $MoS_2$ layer 116 and the underlying GaN channel layer 110, facilitating the bandgap tuning capabilities of the bandgap tuneable p-GaN HEMT 100.

The bandgap tuneable p-GaN HEMT 100 further includes a p-type gallium nitride cap layer 120 located on the second AlGaN buffer layer 118. The p-type gallium nitride cap layer 120 works in conjunction with the underlying layers, particularly the second AlGaN buffer layer 118 and the two dimensional MoS$_2$ layer 116, to enhance the overall performance and controllability of the bandgap tuneable p-GaN HEMT 100. In particular, the p-type doping in the p-type gallium nitride cap layer 120 helps in achieving normally-off operation, which is desirable for power switching applications. In an aspect, the p-type gallium nitride cap layer 120 has a doping concentration of $10^{16}/cm^3$. Such doping concentration is selected to achieve the desired electrical characteristics of the bandgap tuneable p-GaN HEMT 100, balancing the threshold voltage control and the overall device performance. The presence of the p-type gallium nitride cap layer 120 modifies the band structure in the device, raising the conduction band and thereby increasing the threshold voltage of the bandgap tuneable p-GaN HEMT 100.

Herein, the p-type gallium nitride cap layer 120 is located at a distance of about 1 micron from the aluminum source contact 112 and about 6 microns from the aluminum drain contact 114. The specified asymmetric positioning of the p-type gallium nitride cap layer 120, being closer to the aluminum source contact 112 than to the aluminum drain contact 114, is designed to optimize the electric field distribution in the bandgap tuneable p-GaN HEMT 100. This configuration helps in managing the high electric fields that can occur near the drain side of the device during high-voltage operation, contributing to the overall reliability and performance of the bandgap tuneable p-GaN HEMT 100. Further, in an aspect, the p-type gallium nitride cap layer 120 has a length of about 1.4 microns and a thickness of about 60 nanometers. The specified thickness of the p-type gallium nitride cap layer 120 provide effective gate control while maintaining the desired electrical characteristics of the bandgap tuneable p-GaN HEMT 100, while the specified length of the p-type gallium nitride cap layer 120 ensures adequate coverage of the active region of the device, facilitating efficient modulation of the channel conductivity.

The bandgap tuneable p-GaN HEMT 100 further includes a platinum gate contact 122 located on the p-type gallium nitride cap layer 120. Platinum, as a gate metal, contributes to the ability of the bandgap tuneable p-GaN HEMT 100 to withstand high temperatures and voltages. The work function of platinum is suited for forming a good Schottky contact with the p-type gallium nitride cap layer 120, as required for controlling the threshold voltage and overall switching behavior of the bandgap tuneable p-GaN HEMT 100. In an aspect, the platinum gate contact 122 has a length of about 1.4 microns, matching the length of the underlying p-type gallium nitride cap layer 120. This matching dimension ensures complete coverage of the p-type gallium nitride cap layer 120 by the platinum gate contact 122, for effective gate control in the bandgap tuneable p-GaN HEMT 100. In general, this configuration of the p-type gallium nitride cap layer 120 and the platinum gate contact 122, with asymmetric distances from the aluminum source contact 112 and the aluminum drain contact 114, helps in managing the high electric fields that can occur near the drain side of the device during high-voltage operation, contributing to the overall reliability and performance of the bandgap tuneable p-GaN HEMT 100.

To summarize, the bandgap tuneable p-GaN HEMT 100 provides a layered structure built on the SiC substrate 102. The bandgap tuneable p-GaN HEMT 100 incorporates a dual nucleation layer system consisting of the InN nucleation layer 104 and the AlN nucleation layer 106. The first AlGaN buffer layer 108 and the GaN channel layer 110 are deposited on top of these nucleation layers. The active region of the bandgap tuneable p-GaN HEMT 100 includes the aluminum source contact 112 and the aluminum drain contact 114, with the two-dimensional MoS$_2$ layer 116 located between them. The second AlGaN buffer layer 118 is positioned above the MoS$_2$ layer 116. The structure is capped with the p-type gallium nitride layer 120, upon which the platinum gate contact 122 is placed. This unique configuration promotes the bandgap tunability of the device, enhances electron mobility, and provides for precise control over the electrical characteristics of the bandgap tuneable p-GaN HEMT 100.

The bandgap tuneable p-GaN HEMT 100 addresses the growing need for greater power density in smaller circuit areas, increased efficiency, and reduced costs. As silicon technology approaches fundamental physical limits, wide bandgap (WBG) materials offer superior performance at higher voltages, temperatures, and switching frequencies. WBG materials, characterized by high critical electric fields and lower dielectric constants, support operation at higher temperatures before intrinsic carrier density exceeds donor impurity density. GaN, a WBG material, offers lower energy losses, higher overall system efficiencies, and higher breakdown voltages in the bandgap tuneable p-GaN HEMT 100. The large bandgap of GaN facilitates the bandgap tuneable p-GaN HEMT 100 to operate at higher temperatures and switching speeds. GaN eliminates the need for snubbers due to the absence of reverse recovery characteristics, body diode, and minority carriers, thereby reducing switching losses and electromagnetic interference in the bandgap tuneable p-GaN HEMT 100. Tabe 1 below lists different layers and corresponding details.

TABLE 1

| Parameter | Value |
| --- | --- |
| p-type GaN Cap Layer | Thickness = 60 nm, Doping = $10^{16}/cm^{-3}$ |
| First AlGaN Buffer Layer | 2.64 nm |
| Second AlGaN Buffer Layer | 14.7 nm |
| MoS$_2$ Barrier Layer | 0.65 × 2 nm |
| GaN Channel Layer | 34 nm |
| AlN Nucleation Layer | 5 nm |
| InN Nucleation Layer | 5 nm |
| SiC Substrate | 1.99 μm |
| Gate Length | 1.4 μm |
| Source/Drain Contact Length | 1 μm |
| Gate-Source Spacing | 1 μm |
| Gate-Drain Spacing | 6 μm |

Specifications for bandgap tuneable p-GaN HEMT

The bandgap tuneable p-100 GaN HEMT incorporates the 2DEG at the core of the device structure. The monolayer of MoS$_2$, a transition metal dichalcogenide (TMDC) [See: Anushya, G., Benjamin, M., Sarika, R., Pravin, J. C., Sridevi, R., & Nirmal, D. (2023). A review on applications of molybdenum disulfide material: Recent developments. *Micro and Nanostructures*, 207742, incorporated herein by reference in its entirety], is added between the GaN and AlGaN layers in the bandgap tuneable p-GaN HEMT 100, which introduces strain to the structure and facilitates bandgap tuning. The bandgap of the MoS$_2$ layer in the bandgap tuneable p-GaN HEMT 100 increases under compressive strain and potentially reduces to zero under vertical strain. The incorporation of $MoS_2$ in the bandgap tuneable p-GaN HEMT 100 facilitates controlled strain at the heterojunction, providing an effective method to modify the electron band structure of the materials. The layer properties of $MoS_2$ in the bandgap tuneable p-GaN HEMT 100 can be adjusted to control this strain. The electron transport properties of the 2DEG layer can be improved by increasing the Al content in the AlGaN barrier layer. However, the increase of the Al content must be balanced to prevent undesired strain relaxation of the AlGaN barrier layer.

Additionally, the hybrid heterostructure of the bandgap tuneable p-GaN HEMT 100 provides efficient photon absorption and electron-hole creation properties due to enhanced light-matter interactions. Herein, the AlN and InN nucleation along with the AlGaN buffer layers in the structure also serve towards improving the quality of the grown GaN crystals, since direct growth on SiC leads to background leakages and other phenomena that can reduce quality.

Figure 2:
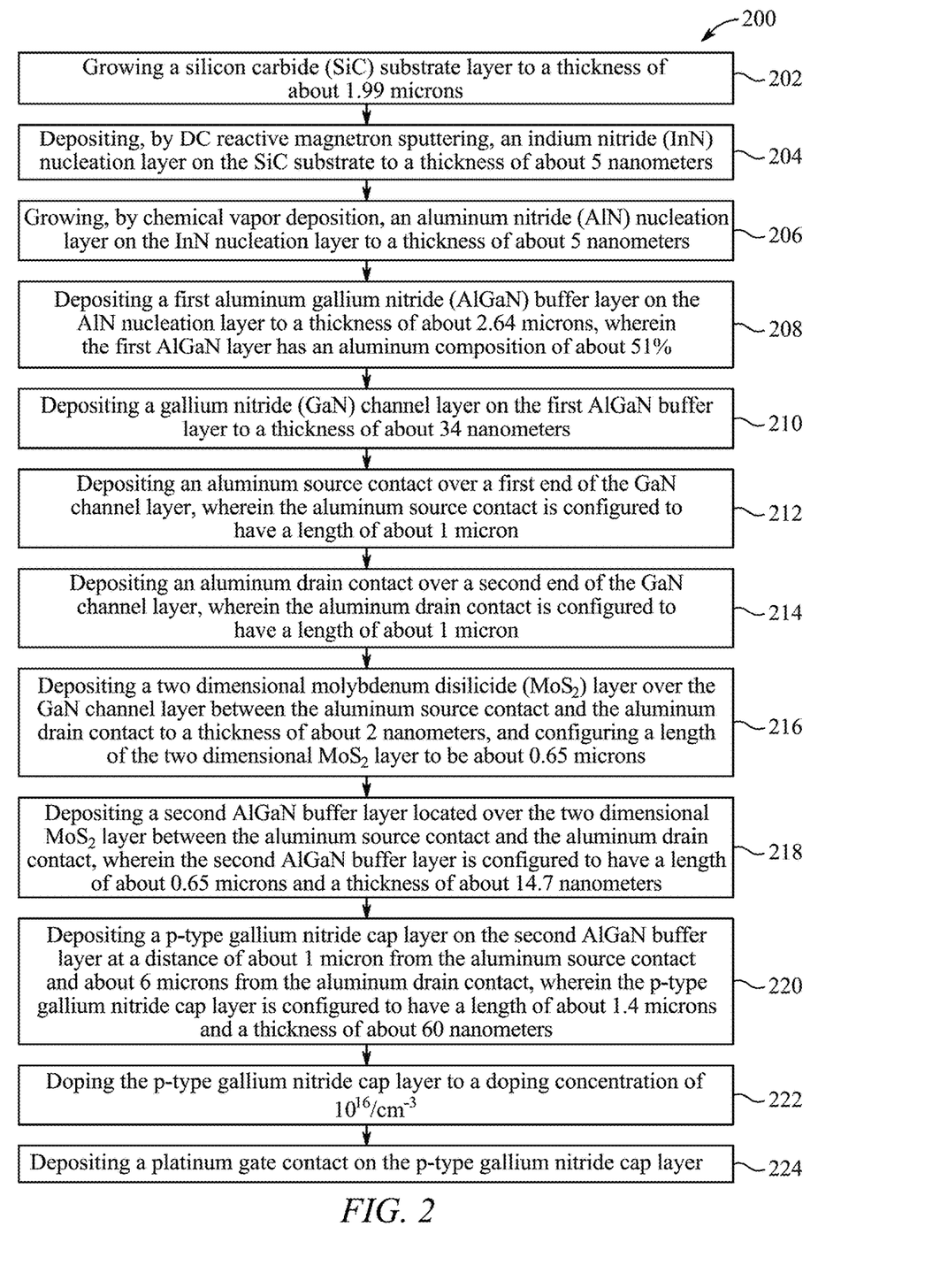
FIG. 2 is an exemplary flowchart of a method of making a bandgap tuneable p-GaN HEMT, according to certain embodiments.

Referring to FIG. 2, the present disclosure further provides a method (as represented by a flowchart, referred by reference numeral 200) of making the bandgap tuneable p-GaN HEMT 100. The method 200 includes a series of steps. These steps are only illustrative, and other alternatives may be considered where one or more steps are added, one or more steps are removed, or one or more steps are provided in a different sequence without departing from the scope of the present disclosure. Various variants disclosed above, with respect to the aforementioned bandgap tuneable p-GaN HEMT 100 apply mutatis mutandis to the present method 200.

At step 202, the method 200 includes growing the SiC substrate layer 102 to a thickness of about 1.99 microns. This growth of the SiC substrate layer 102 serves as the foundation for the bandgap tuneable p-GaN HEMT 100. The specific thickness of 1.99 microns is chosen to provide a stable base while optimizing thermal management and overall device dimensions.

At step 204, the method 200 includes depositing, by DC reactive magnetron sputtering, the InN nucleation layer 104 on the SiC substrate layer 102 to a thickness of about 5 nanometers. This step utilizes DC reactive magnetron sputtering to achieve precise control over the thickness and quality of the InN nucleation layer 104. The specified thickness provides for managing lattice mismatch between the SiC substrate layer 102 and subsequent layers.

At step 206, the method 200 includes growing, by chemical vapor deposition, the AlN nucleation layer 106 on the InN nucleation layer 104 to a thickness of about 5 nanometers. Chemical vapor deposition is employed in this step to ensure high-quality, uniform growth of the AlN nucleation layer 106. The specified thickness complements the InN nucleation layer 104 in strain management and promotes high-quality crystal growth in subsequent layers.

At step 208, the method 200 includes depositing the first AlGaN buffer layer 108 on the AlN nucleation layer 106 to a thickness of about 2.64 microns. Herein, the first AlGaN buffer layer 108 has an aluminum composition of about 51%. This step involves the deposition of the AlGaN buffer layer 108 with precise control over both thickness and aluminum composition. The specific parameters help with managing strain and creating a strong polarization field necessary for the formation of the 2DEG in the bandgap tuneable p-GaN HEMT 100.

At step 210, the method 200 includes depositing the GaN channel layer 110 on the first AlGaN buffer layer 108 to a thickness of about 34 nanometers. The deposition of the GaN channel layer 110 facilitates the formation of the 2DEG in the bandgap tuneable p-GaN HEMT 100. The specific thickness is chosen to optimize the confinement of the 2DEG while maintaining high electron mobility.

At step 212, the method 200 includes depositing the aluminum source contact 112 over the first end 110*a* of the GaN channel layer 110. Herein, the aluminum source contact 112 is configured to have a length of about 1 micron. This step involves the careful deposition of the aluminum source contact 112, with precise control over its dimensions. The specified length is selected to provide sufficient area for current flow while permitting formation of other layers adjoining thereto.

At step 214, the method 200 includes depositing the aluminum drain contact 114 over the second end 110*b* of the GaN channel layer 110. Herein, the aluminum drain contact 114 is configured to have a length of about 1 micron. This step generally mirrors the deposition of the aluminum source contact 112, ensuring symmetry in the contact structure of the bandgap tuneable p-GaN HEMT 100. The identical length for both source and drain contacts contributes to balanced electrical characteristics in the device.

At step 216, the method 200 includes depositing the two dimensional $MoS_2$ layer 116 over the GaN channel layer 110 between the aluminum source contact 112 and the aluminum drain contact 114 to a thickness of about 2 nanometers and configuring a length of the two dimensional $MoS_2$ layer 116 to be about 0.65 microns. This step involves the precise deposition of the $MoS_2$ layer 116, which provides desired properties to the bandgap tuneable p-GaN HEMT 100. The deposition process is controlled to ensure uniformity and quality of the $MoS_2$ layer 116, as variations in thickness or composition may affect the performance of the bandgap tuneable p-GaN HEMT 100. The specific thickness is chosen to achieve the desired strain effects and bandgap tuning capabilities, while the specified length ensures optimal coverage of the active region between the source and drain contacts.

In an aspect of the present disclosure, the method 200 includes depositing the two dimensional $MoS_2$ layer 116 in the first $MoS_2$ layer 116*a* having a thickness of about 1 nanometer and the second $MoS_2$ layer 116*b* having a thickness of about 1 nanometer. This two-step deposition process provides for greater control over the properties of the $MoS_2$ layer 116 in the bandgap tuneable p-GaN HEMT 100. By depositing two separate monolayers instead of a single bilayer, the method 200 facilitates finer tuning of the strain and electrical characteristics of the $MoS_2$ layer 116, thereby enhancing the tunability and performance characteristics of the bandgap tuneable p-GaN HEMT 100.

At step 218, the method 200 includes depositing the second AlGaN buffer layer 118 located over the two dimensional $MoS_2$ layer 116 between the aluminum source contact 112 and the aluminum drain contact 114. Herein, the second AlGaN buffer layer 118 is configured to have a length of about 0.65 microns and a thickness of about 14.7 nanometers. This step involves the deposition of the second AlGaN buffer layer 118 with precise control over its dimensions. The specific length and thickness are chosen to work in conjunction with the $MoS_2$ layer 116 to enhance control over the 2DEG in the bandgap tuneable p-GaN HEMT 100.

At step 220, the method 200 includes depositing the p-type gallium nitride cap layer 120 on the second AlGaN buffer layer 118 at a distance of about 1 micron from the aluminum source contact 112 and about 6 microns from the aluminum drain contact 114. Herein, the p-type gallium nitride cap layer 120 is configured to have a length of about 1.4 microns and a thickness of about 60 nanometers. This step involves the precise deposition and positioning of the p-type gallium nitride cap layer 120. The specific dimensions and positioning helps in achieving the desired electrical characteristics and normally-off operation in the bandgap tuneable p-GaN HEMT 100.

At step 222, the method 200 includes doping the p-type gallium nitride cap layer 120 to a doping concentration of $10^{16}/cm^3$. This step involves the introduction of p-type dopants into the gallium nitride cap layer 120. The specific doping concentration is chosen to optimize the threshold voltage control and overall performance of the bandgap tuneable p-GaN HEMT 100.

At step 224, the method 200 includes depositing the platinum gate contact 122 on the p-type gallium nitride cap layer 120. This step involves the deposition of the platinum gate contact 122, which serves as the control electrode for the bandgap tuneable p-GaN HEMT 100. The use of platinum and the precise positioning of the platinum gate contact 122 on the p-type gallium nitride cap layer 120 helps in achieving the desired gate control and high-temperature operation capabilities of the bandgap tuneable p-GaN HEMT 100.

In aspects of the present disclosure, the method 200 further includes additional steps for operating and testing the bandgap tuneable p-GaN HEMT 100. These steps involve connecting various voltage sources and measuring performance of the bandgap tuneable p-GaN HEMT 100. Specifically, the method 200 includes connecting an input voltage source to the aluminum source contact 112. This connection permits the application of a controlled voltage to the source of the bandgap tuneable p-GaN HEMT 100. The method 200 also includes connecting a gate bias voltage source to the platinum gate contact 122. This connection supports the application of a bias voltage to control the conductivity of the channel in the bandgap tuneable p-GaN HEMT 100. The method 200 further includes connecting an output terminal to the aluminum drain contact 114, which facilitates the measurement of the output current and voltage characteristics of the bandgap tuneable p-GaN HEMT 100.

Once these connections are established, the method 200 proceeds with further steps. Herein, the method 200 includes applying an input voltage in a range of about 4 V to about 8 V to the aluminum source contact 112. This range of input voltages is selected to test the performance of the bandgap tuneable p-GaN HEMT 100 under various operating conditions. The method 200 also includes applying a gate bias to the platinum gate contact 122 in a range of about 4 V to about 10 V. This range of gate bias voltages supports the characterization of behavior of the bandgap tuneable p-GaN HEMT 100 across different operating modes, from near-threshold to full enhancement.

As a result of these applied voltages, the method 200 includes generating a peak saturation drain current $I_D$ in a range of about 0.49 A to about 0.73 A at the aluminum drain contact 114. This range of peak saturation drain currents demonstrates the high current-carrying capacity of the bandgap tuneable p-GaN HEMT 100, which is a key performance metric for power electronics applications. The variation in peak saturation drain current corresponds to the different combinations of input voltage and gate bias applied, indicating performance of the bandgap tuneable p-GaN HEMT 100 across its operational range.

Figure 3:
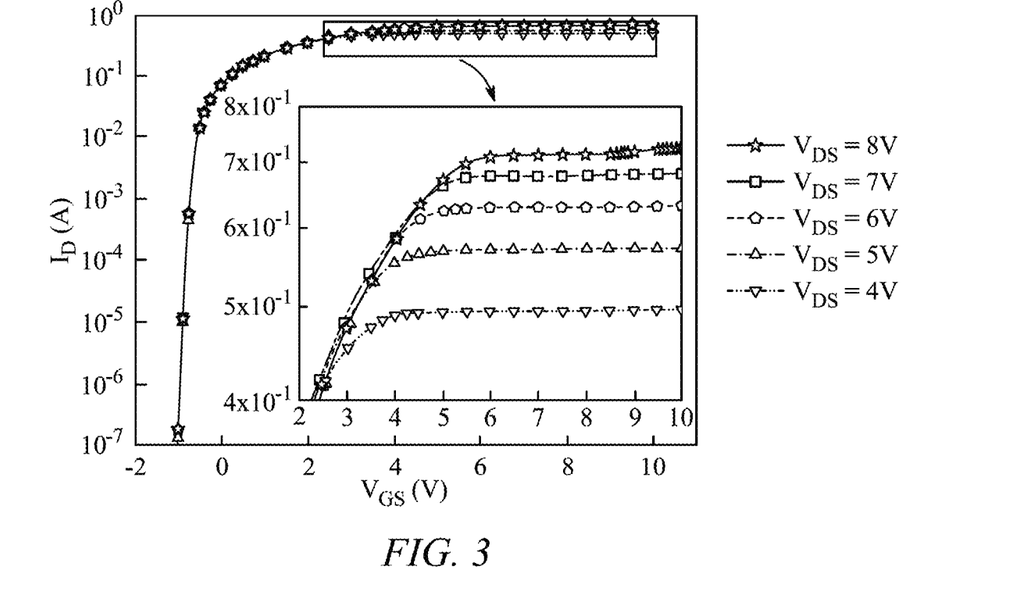
FIG. 3 is an exemplary graph illustrating drain current versus gate voltage characteristics of the bandgap tuneable p-GaN HEMT on a logarithmic scale for different drain voltages, according to certain embodiments.
Figure 4:
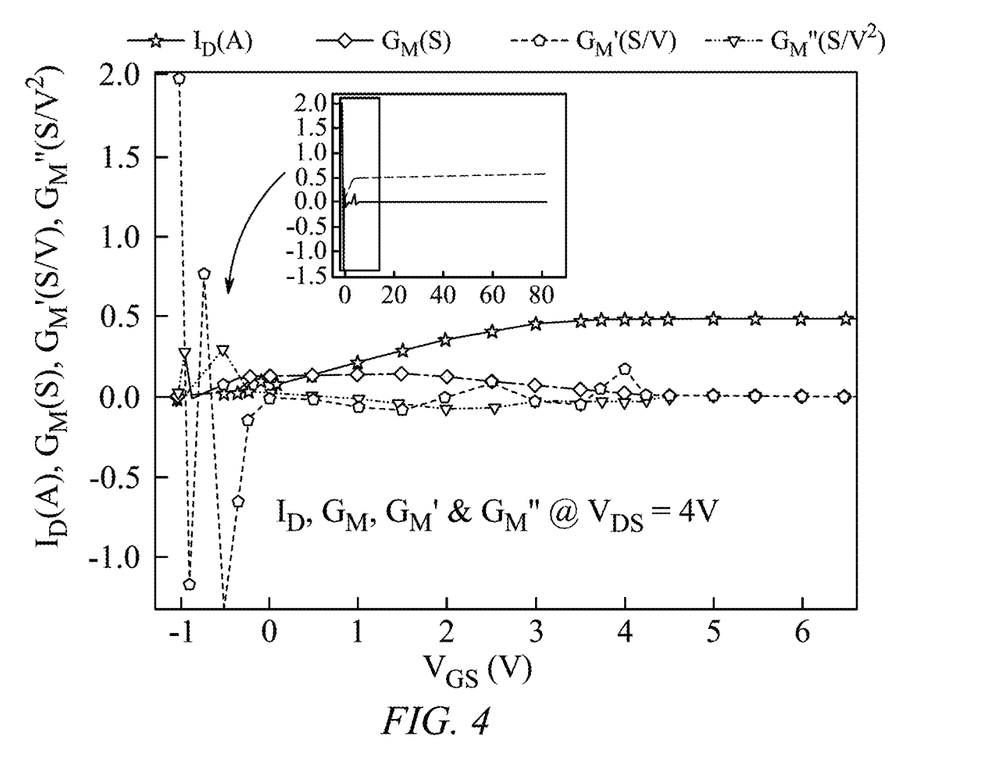
FIG. 4 is an exemplary graph illustrating current, transconductance, and its derivative profile for the bandgap tuneable p-GaN HEMT, according to certain embodiments.
Figure 5:
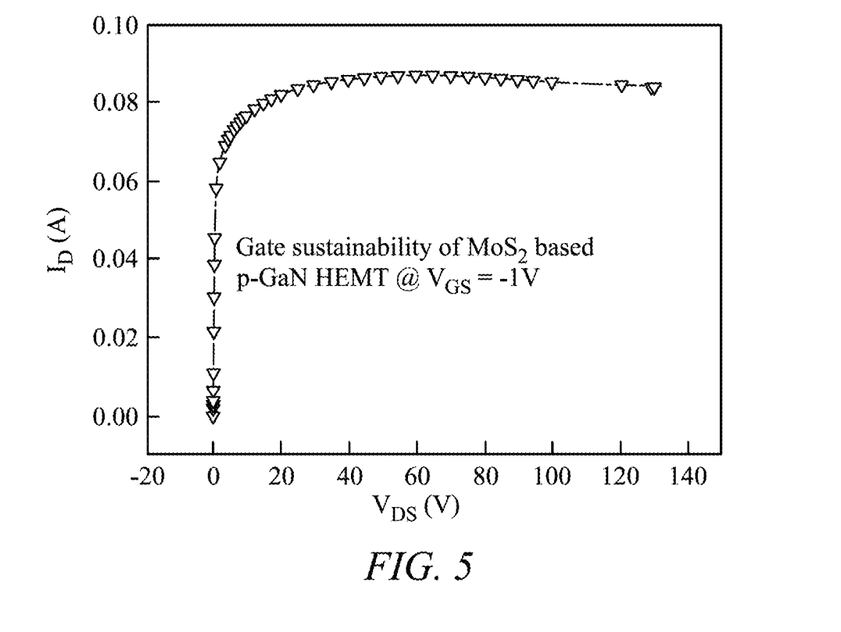
FIG. 5 is an exemplary graph illustrating $I_D$ versus $V_{DS}$ plot representing gate sustainability for the bandgap tuneable p-GaN HEMT, according to certain embodiments.
Figure 6:
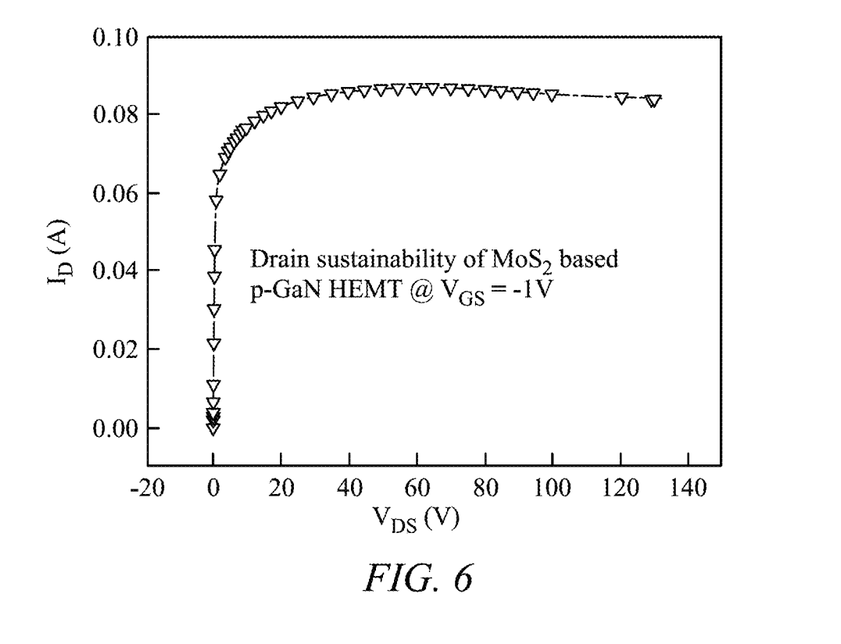
FIG. 6 is an exemplary graph illustrating $I_D$ versus $V_{GS}$ plot representing drain sustainability for the bandgap tuneable p-GaN HEMT, according to certain embodiments.
Figure 7:
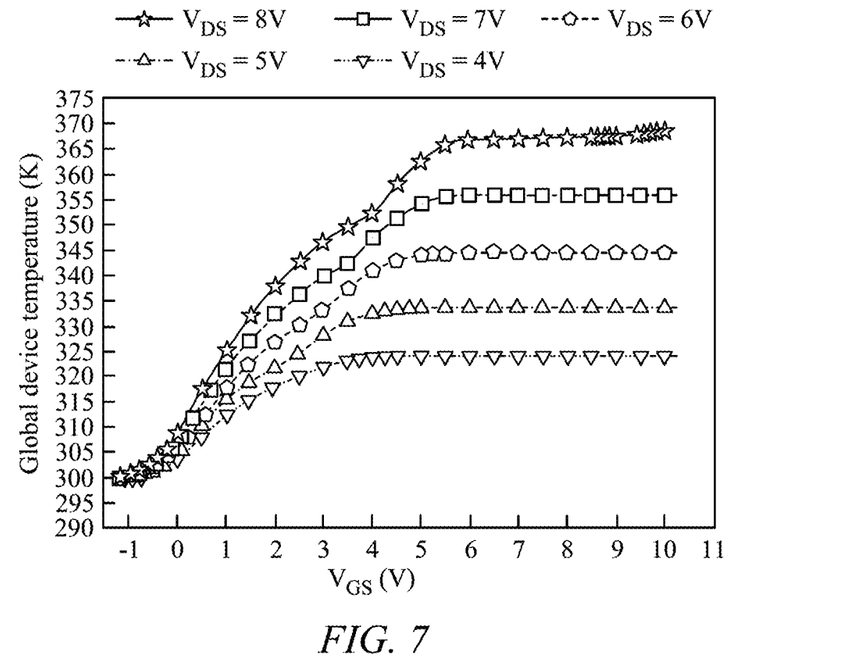
FIG. 7 is an exemplary graph illustrating overall device temperature versus gate bias voltage for the bandgap tuneable p-GaN HEMT, according to certain embodiments.
Figure 8:
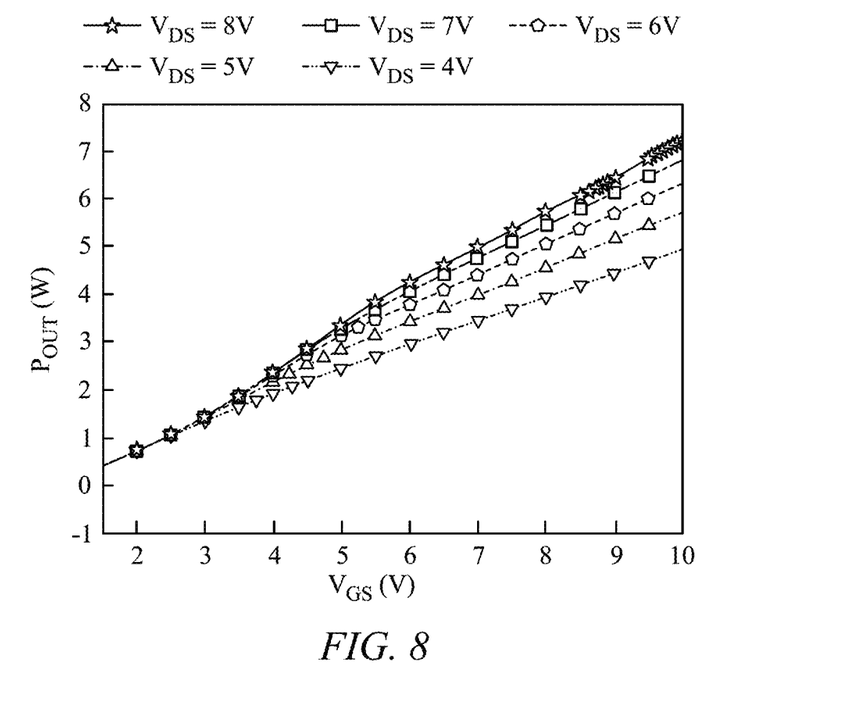
FIG. 8 is an exemplary graph illustrating linearity assessment of output power profile versus gate bias voltage of the bandgap tuneable p-GaN HEMT, according to certain embodiments.

The above-mentioned results are discussed further in reference to FIGS. 3-8 in the proceeding paragraphs. The bandgap tuneable p-GaN HEMT 100 utilizing the two-dimensional $MoS_2$ layer 116 as a barrier along with the AlGaN buffer layers 108, 118 was simulated utilizing SIL-VACO TCAD software. The drain current-gate voltage ($I_D$-$V_{GS}$) characteristics of the bandgap tuneable p-GaN HEMT 100 are illustrated at various drain voltages ranging from 4 V to 8 V, as shown in FIG. 3. The incorporation of the two-dimensional $MoS_2$ layer 116 increases the electron mobility in the 2DEG region of the bandgap tuneable p-GaN HEMT 100. Additionally, the inclusion of the two-dimensional $MoS_2$ layer 116 facilitates strain engineering and band structure tuning for a wide range of applications. The device transconductance with its first and second-order derivative profiles was extracted for estimating dependencies of transconductances gm, gm' and gm'' on bias voltages, as depicted in FIG. 4. The gate of the bandgap tuneable p-GaN HEMT 100 demonstrated reliable operation up to 82 V at $V_{DS}$=4 V, where $V_{DS}$ was measured between the aluminum drain contact 114 and the aluminum source contact 112, as shown in FIG. 5. Furthermore, the drain of the bandgap tuneable p-GaN HEMT 100 exhibited reliable operation up to 131 V at $V_{GS}$=−1 V, where $V_{GS}$ was measured between the platinum gate contact 122 and the aluminum source contact 112, as illustrated in FIG. 6. The bandgap tuneable p-GaN HEMT 100 generated a power of 7.3 W at $V_{DS}$=8 V and $V_{GS}$=10 V, with a drain current of 0.72 A and an output power of 7.2 W at this operating point, as illustrated in FIG. 8. The $I_{ON}/I_{OFF}$ ratio of the bandgap tuneable p-GaN HEMT 100 was of the order of $10^6$, and the $R_{ON}/R_{OFF}$ ratio was of the order of $10^{-6}$. The threshold voltage of the bandgap tuneable p-GaN HEMT 100 was 0.85 V at $V_{DS}$=4 V, as shown in FIG. 3.

More specifically, FIG. 3 illustrates current-voltage characteristics of the bandgap tuneable p-GaN HEMT 100 incorporating the two dimensional $MoS_2$ layer 116 on a logarithmic scale. The graph depicts the drain current ($I_D$) versus gate-to-source voltage ($V_{GS}$) characteristics for various drain-to-source voltages ($V_{DS}$) ranging from 4 V to 8 V. As may be seen, the inclusion of the two dimensional $MoS_2$ layer 116 in the bandgap tuneable p-GaN HEMT 100 resulted in higher drain currents compared to conventional structures. The peak saturation current for the bandgap tuneable p-GaN HEMT 100 at a gate bias of 10 V ranged from 0.49 A at $V_{DS}$=4 V to 0.73 A at $V_{DS}$=8 V, demonstrating capability of the bandgap tuneable p-GaN HEMT 100 to operate at relatively higher $V_{DS}$ values.

FIG. 4 illustrates a magnified plot view of current, transconductance, and its derivative profile for the bandgap tuneable p-GaN HEMT 100, assessed up to 80 V. Herein, the bandgap tuneable p-GaN HEMT 100 was configured to have a peak saturation drain current $I_D$ in a range of about 0.49 A to about 0.73 A for an applied operating voltage $V_{DS}$ in a range of about 4 V to about 8 V and an applied gate bias $V_{GS}$ of about 10 V, where $V_{DS}$ was measured between the aluminum drain contact 114 and the aluminum source contact 112, $V_{GS}$ was measured between the platinum gate contact 122 and the aluminum source contact 112 and $I_D$ was measured at the aluminum drain contact 114. This performance characteristic is evident from the I-V curves shown in FIG. 4, demonstrating the high current-carrying capacity of the bandgap tuneable p-GaN HEMT 100 across its operational voltage range. Also, the GaN channel layer 110 was configured to have an electron mobility in a range of 800 $cm^2/V$ seconds to about 2000 $cm^2/V$ seconds. That is, the high drain current values observed in the bandgap tuneable p-GaN HEMT 100 are attributed to the high electron mobility in the GaN channel layer 110, which ranges from 800 cm$^2$/V s to 2000 cm$^2$/V s in the heterogeneous structure [See: L Berdalovic, M. Poljak, and T. Suligoj, "Mobility Limitations in Single- and Double-Heterostructure GaN-HEMTs," in *IEEE Transactions on Electron Devices*, vol. 70, no. 11, pp. 5577-5583, November 2023, incorporated herein by reference in its entirety], as well as the high carrier mobility in the two dimensional MoS$_2$ layer 116. Further, herein, the bandgap tuneable p-GaN HEMT 100 was configured to have an ON current of about 0.73 A and an OFF current of about $-2.14\times10^{-7}$ A for an applied operating voltage $V_{DS}$=8 V, where $V_{DS}$ was measured between the aluminum drain contact 114 and the aluminum source contact 112. These ON and OFF current values, which can be observed in the current profile of FIG. 4, demonstrated high ON/OFF current ratio for the bandgap tuneable p-GaN HEMT 100, as desired for efficient switching operations. Also, the bandgap tuneable p-GaN HEMT 100 was configured to have an ON resistance of about 20.18 ohms and an off resistance of about $-7.8\times10^{-6}$ ohms. These resistance values, derived from the current-voltage characteristics shown in FIG. 4, indicate low ON-state power loss and high OFF-state isolation for the bandgap tuneable p-GaN HEMT 100, as desired for efficient switching operations. Furthermore, the bandgap tuneable p-GaN HEMT 100 was configured to have a threshold voltage of about 0.85 V for an applied operating voltage $V_{DS}$ of about 4 V, where $V_{DS}$ was measured between the aluminum drain contact 114 and the aluminum source contact 112. This threshold voltage can be observed in the transconductance profile of FIG. 4, marking the point at which the device begins to conduct significantly.

In particular, as illustrated in FIG. 4, the transconductance and its first and second-order derivatives for the bandgap tuneable p-GaN HEMT 100 exhibit almost flat transconductance after 4.5 V of $V_{GS}$, indicating the amplification capability of the device. The ON current of the bandgap tuneable p-GaN HEMT 100 is 0.73 A, with an OFF current of $-2.14E-7$ at $V_{DS}$=8V, resulting in an $I_{ON}/I_{OFF}$ ratio of the order of $3\times10^6$. The ON resistance ($R_{ON}$) of the bandgap tuneable p-GaN HEMT 100 was 20.18Ω, and the OFF resistance ($R_{OFF}$) was $-7.8E6$Ω, yielding an $R_{ON}/R_{OFF}$ ratio of the order of $10^{-6}$ [See: Z. Zheng, et al., "High $I_{on}$ and $I_{on}/I_{off}$ Ratio Enhancement-Mode Buried p-Channel GaN-MOSFETs on p-GaNGate Power HEMT Platform," in *IEEE Electron Device Letters*, vol. 41, no. 1, pp. 26-29, January 2020, incorporated herein by reference in its entirety]. The threshold voltage of the bandgap tuneable p-GaN HEMT 100 was measured to be 0.85 V at $V_{DS}$=4 V [See: I. Hwang, et al., "p-GaNGate HEMTs with Tungsten Gate Metal for High Threshold Voltage and Low Gate Current," in *IEEE Electron Device Letters*, vol. 34, no. 2, pp. 202-204, February 2013, incorporated herein by reference in its entirety].

FIG. 5 illustrates $I_D$-$V_{GS}$ plot depicting gate reliability of the bandgap tuneable p-GaN HEMT 100 up to 81.6 V. This graph highlighted the ability of the device to maintain stable operation under high gate voltages. FIG. 6 illustrates $I_D$-$V_{GS}$ plot depicting drain reliability of the bandgap tuneable p-GaN HEMT 100. This graph highlighted the drain reliability of the device up to 131 V. Herein, a gate reliability of the bandgap tuneable p-GaN HEMT 100 is configured to be in a range of 0 V to about 81.6 V, and a drain sustainability of the bandgap tuneable p-GaN HEMT 100 is configured to be in a range of 0 V to about 131 V at $V_{GS}$ of about $-1$ V, where $V_{GS}$ was measured between the platinum gate contact 122 and the aluminum source contact 112. As may be seen in FIG. 5, the gate terminal of the bandgap tuneable p-GaN HEMT 100 showed reliable operation up to 81.6 V, providing a constant current supply of 0.57 A at $V_{DS}$=4 V, where $V_{DS}$ is measured between the aluminum drain contact 114 and the aluminum source contact 112. This high gate voltage tolerance is attributed to the unique structure of the device, particularly the incorporation of the two dimensional MoS$_2$ layer 116 and the p-type gallium nitride cap layer 120. Further, as may be seen from FIG. 6, the high drain voltage sustainability of the bandgap tuneable p-GaN HEMT 100 is a result of feature of the AlGaN buffer layers 108, 118 of sustaining under high temperature and voltage conditions [See: J. Sun et al., "Gate Characteristics of Enhancement-Mode Fully Depleted p-GaN Gate HEMT," in *IEEE Electron Device Letters*, vol. 44, no. 12, pp. 2015-2018, December 2023, incorporated herein by reference in its entirety]. The ability of the bandgap tuneable p-GaN HEMT 100 to operate reliably at such high drain voltages makes it suitable for high-power applications. The gate and drain breakdown voltages are key parameters in preventing unintended breakdown and ensuring the long-term reliability of the bandgap tuneable p-GaN HEMT 100. Exceeding these voltage limits may lead to permanent damage, affecting the performance and operational lifespan of the device. The high breakdown voltages demonstrated in FIG. 5 and FIG. 6 highlight the reliability of the bandgap tuneable p-GaN HEMT 100 under extreme operating conditions.

FIG. 7 illustrates the assessment of the bandgap tuneable p-GaN HEMT 100 for overall device temperature versus the gate bias. The graph presents the Global Device Temperature of the bandgap tuneable p-GaN HEMT 100 under various operating conditions. Herein, the bandgap tuneable p-GaN HEMT 100 is configured to have a maximum global device temperature of about 369 degrees Kelvin for an applied operating voltage $V_{DS}$ of about 8 V and an applied gate bias $V_{GS}$ of about 10 V, where $V_{DS}$ is measured between the aluminum drain contact 114 and the aluminum source contact 112 and where $V_{GS}$ is measured between the platinum gate contact 122 and the aluminum source contact 112. This maximum temperature is observed in the saturation region of the device operation, as illustrated in FIG. 7. Further, the bandgap tuneable p-GaN HEMT 100 was configured to have a maximum global device temperature within a range of about 320 degrees Kelvin to about 369 degrees Kelvin for an applied operating voltage $V_{DS}$ in a range of about 4 V to about 8 V and an applied gate bias $V_{GS}$ in a range of about 4 V to about 10 V, where $V_{DS}$ was measured between the aluminum drain contact 114 and the aluminum source contact 112 and where $V_{GS}$ was measured between the platinum gate contact 122 and the aluminum source contact 112. This temperature range, depicted in FIG. 7, demonstrates a thermal performance of the device across its operational voltage range. The relatively moderate temperature rise, even at high voltages and currents, can be attributed to the efficient thermal management properties of the device structure, including the SiC substrate 102 and the designed layer stack. The temperature characteristics shown in FIG. 7 help in understanding the thermal behavior of the bandgap tuneable p-GaN HEMT 100 and its suitability for high-power applications where thermal management is a significant concern.

FIG. 8 illustrates linearity assessment of output power profile of the bandgap tuneable p-GaN HEMT 100. The graph outlines a linear relation between $P_{OUT}$ (Output Power) and gate bias for the device [See: Ambacher, O., Smart, J., Shealy, J. R., Weimann, N. G., Chu, K., Murphy, M., . . . & Hilsenbeck, J. (1999). Two-dimensional electron gases induced by spontaneous and piezoelectric polarization charges in N- and Ga-face AlGaN/GaN heterostructures. *Journal of applied physics,* 85(6), 3222-3233, incorporated herein by reference in its entirety]. Herein, the bandgap tuneable p-GaN HEMT 100 was configured to generate an output power of about 7.3 W at an applied operating voltage $V_{DS}$ of about 8 V and an applied gate bias $V_{GS}$ of about 10 V, where $V_{DS}$ was measured between the aluminum drain contact 114 and the aluminum source contact 112 and $V_{GS}$ was measured between the platinum gate contact 122 and the aluminum source contact 112. This high output power highlighted the capability of the device for high-power applications, as illustrated in FIG. 8. Further, herein, the bandgap tuneable p-GaN HEMT 100 was configured to have a linear relationship of output power versus applied gate bias $V_{GS}$ in a range of about 4 V to about 10 V, where $V_{GS}$ was measured between the platinum gate contact 122 and the aluminum source contact 112. This linear relationship, depicted in FIG. 8, indicated consistent and predictable power output across the operational range of gate voltages, which is advantageous for precise power control in various applications. In particular, as shown in FIG. 8, a maximum power of 7.3 W was achieved at $V_{DS}$=8V and $V_{GS}$=10 V, where $V_{DS}$ was measured between the aluminum drain contact 114 and the aluminum source contact 112, and $V_{GS}$ was measured between the platinum gate contact 122 and the aluminum source contact 112. The range of output power reported for the bandgap tuneable p-GaN HEMT 100 at $V_{DS}$ values from 4 V to 8 V was 5 W to 7.2 W [See: M. T. Azad et al., "AlGaN/GaN-Based Multimetal Gated High-Electron-Mobility Transistor with Improved Linearity," in *IEEE Transactions on Electron Devices,* vol. 70, no. 11, pp. 5570-5576, November 2023, incorporated herein by reference in its entirety]. This linear power profile demonstrated the excellent analog characteristics of the bandgap tuneable p-GaN HEMT 100 in terms of current, transconductance, and power output. The device showed a considerably high drain current of 0.72 A and an output power of 7.2 W at $V_{DS}$ of 8 V and $V_{GS}$ of 10 V. The $I_{ON}/I_{OFF}$ ratio of the bandgap tuneable p-GaN HEMT 100 was of a relatively high order at about $10^6$, and the on-to-off resistance ratio was $10^{-6}$. The device maintained a stable transconductance of 0.03 S for a wide range of voltages up to $V_{GS}$=81 V. Additionally, the gate and drain of the bandgap tuneable p-GaN HEMT 100, demonstrate reliability up to 81.6 V and 131 V, respectively, providing flexibility for high-voltage applications. These characteristics highlight the extensive potential of the two-dimensional $MoS_2$ layer 116 in advancing transistor technology.

The bandgap tuneable p-GaN HEMT 100 of the present disclosure incorporates the two-dimensional $MoS_2$ layer 116 between the GaN channel layer 110 and the second AlGaN buffer layer 118. This unique configuration facilitates band gap tuneability and introduces strain engineering capabilities. The incorporation of the two-dimensional $MoS_2$ layer 116 enhances the device performance by increasing the electron mobility and electron density in the 2DEG region.

The bandgap tuneable p-GaN HEMT 100 facilitates tuning of the band gap and strain in the epitaxial layers. The bandgap tuneable p-GaN HEMT 100, with the GaN channel layer 110 placed on top of the first AlGaN buffer layer 108, creates a lattice mismatch that induces tensile strain on the AlGaN layer, leading to piezoelectric polarization. This polarization generates an electric field in the crystal structure, resulting in band bending, which significantly influences the current-voltage characteristics and overall device performance. The incorporation of the two-dimensional $MoS_2$ layer 116 facilitates precise tuning of band bending and strain by increasing the electron density and mobility of the 2DEG. This tunable band gap and strain engineering capability makes the bandgap tuneable p-GaN HEMT 100 suitable for a wide range of applications, providing enhanced flexibility and performance compared to conventional HEMT structures. The bandgap tuneable p-GaN HEMT 100 also benefits from using the InN nucleation layer 104 deposited on the SiC substrate 102, improving the crystallographic orientation of the subsequent AlN nucleation layer 106. This results in improved orientation along the desired axis, formation of dense films with uniform surfaces and large grains, high homogeneity, good crystallinity, and low surface roughness. These characteristics contribute to the overall performance and reliability of the bandgap tuneable p-GaN HEMT 100, addressing challenges associated with the growth of high-quality III-nitride layers on SiC substrates.

A first embodiment describes a bandgap tuneable p-GaN high electron mobility transistor (HEMT) 100, comprising: a silicon carbide (SiC) substrate 102; an indium nitride (InN) nucleation layer 104 deposited on the SiC substrate 102, wherein the InN nucleation layer 104 has a thickness of about 5 nanometers; an aluminum nitride (AlN) nucleation layer 106 grown on the InN nucleation layer 104, wherein the AlN nucleation layer has a thickness of about 5 nanometers; a first aluminum gallium nitride (AlGaN) buffer layer 108 located on the AlN nucleation layer 106; a gallium nitride (GaN) channel layer 110 located on the first AlGaN buffer layer 108; an aluminum source contact 112 located over a first end 110a of the GaN channel layer 110; an aluminum drain contact 114 located over a second end 110b of the GaN channel layer 110; a two dimensional molybdenum disulfide ($MoS_2$) layer 116 located over the GaN channel layer 110 between the aluminum source contact 112 and the aluminum drain contact 114, wherein the two dimensional $MoS_2$ layer 116 has a thickness of about 2 nanometers; a second aluminum gallium nitride (AlGaN) buffer layer 118 located over the two dimensional $MoS_2$ layer 116 between the aluminum source contact 112 and the aluminum drain contact 114; a p-type gallium nitride cap layer 120 located on the second AlGaN buffer layer 118 at a distance of about 1 micron from the aluminum source contact 112 and about 6 microns from the aluminum drain contact 114; and a platinum gate contact 122 located on the p-type gallium nitride cap layer 120.

In an aspect, the SiC substrate 102 layer has a thickness of about 1.99 microns; the first AlGaN buffer layer 108 has a thickness of about 2.64 microns and an aluminum composition of about 51%; the GaN channel layer 110 has a thickness of about 34 nanometers; the aluminum source contact 112 has a length of about 1 micron; the aluminum drain contact 114 has a length of about 1 micron; the two dimensional $MoS_2$ layer 116 has a length of about 0.65 microns; the second AlGaN buffer layer 118 has a length of about 0.65 microns and a thickness of about 14.7 nanometers; the p-type gallium nitride cap layer 120 has a length of about 1.4 microns and a thickness of about 60 nanometers; and the platinum gate contact 122 has a length of about 1.4 microns.

In an aspect, the two dimensional $MoS_2$ layer 116 is configured to increase the bandgap under compressive strain and to decrease the bandgap under tensile strain.

In an aspect, the p-type gallium nitride cap layer 120 has a doping concentration of $10^{16}/cm^{-3}$.

In an aspect, the two dimensional $MoS_2$ layer 116 comprises a first $MoS_2$ layer 116a having a thickness of about 1 nanometer and a second $MoS_2$ layer 116b having a thickness of about 1 nanometer.

In an aspect, the indium nitride (InN) nucleation layer 104 is deposited on the SiC substrate 102 using DC reactive magnetron sputtering.

In an aspect, the aluminum nitride nucleation layer is grown on the indium nitride (InN) nucleation layer 104 by chemical vapor deposition.

In an aspect, the bandgap tuneable p-GaN HEMT 100 is configured to have a maximum global device temperature of about 369 degrees Kelvin for an applied operating voltage $V_{DS}$ of about 8 V and an applied gate bias $V_{GS}$ of about 10 V, where $V_{DS}$ is measured between the aluminum drain contact 114 and the aluminum source contact 112 and where $V_{GS}$ is measured between the platinum gate contact 122 and the aluminum source contact 112.

In an aspect, the bandgap tuneable p-GaN HEMT 100 is configured to have a maximum global device temperature within a range of about 320 degrees Kelvin to about 369 degrees Kelvin for an applied operating voltage $V_{DS}$ in a range of about 4 V to about 8 V and an applied gate bias $V_{GS}$ in a range of about 4 V to about 10 V, where $V_{DS}$ is measured between the aluminum drain contact 114 and the aluminum source contact 112 and where $V_{GS}$ is measured between the platinum gate contact 122 and the aluminum source contact 112.

In an aspect, the bandgap tuneable p-GaN HEMT 100 is configured to have a peak saturation drain current $I_D$ in a range of about 0.49 A to about 0.73 A for an applied operating voltage $V_{DS}$ in a range of about 4 V to about 8 V and an applied gate bias $V_{GS}$ of about 10 V, where $V_{DS}$ is measured between the aluminum drain contact 114 and the aluminum source contact 112, $V_{GS}$ is measured between the platinum gate contact 122 and the aluminum source contact 112 and $I_D$ is measured at the aluminum drain contact 114.

In an aspect, the gallium nitride (GaN) channel layer 110 is configured to have an electron mobility in a range of 800 $cm^2$/V seconds to about 2000 $cm^2$/V seconds.

In an aspect, the bandgap tuneable p-GaN HEMT 100 is configured to have an ON current of about 0.73 A and an OFF current of about $-2.14 \times 10^{-7}$ A for an applied operating voltage $V_{DS}$=8 V, where $V_{DS}$ is measured between the aluminum drain contact 114 and the aluminum source contact 112.

In an aspect, the bandgap tuneable p-GaN HEMT 100 is configured to have an ON resistance of about 20.18 ohms and an off resistance of about $-7.8 \times 10^{-6}$ ohms.

In an aspect, the bandgap tuneable p-GaN HEMT 100 is configured to have a threshold voltage of about 0.85 V for an applied operating voltage $V_{DS}$ of about 4 V, where $V_{DS}$ is measured between the aluminum drain contact 114 and the aluminum source contact 112.

In an aspect, the bandgap tuneable p-GaN HEMT 100 is configured to generate an output power of about 7.3 W at an applied operating voltage $V_{DS}$ of about 8 V and an applied gate bias $V_{GS}$ of about 10 V, where $V_{DS}$ is measured between the aluminum drain contact 114 and the aluminum source contact 112 and $V_{GS}$ is measured between the platinum gate contact 122 and the aluminum source contact 112.

In an aspect, the bandgap tuneable p-GaN HEMT 100 is configured to have a linear relationship of output power versus applied gate bias $V_{GS}$ in a range of about 4 V to about 10 V, where $V_{GS}$ is measured between the platinum gate contact 122 and the aluminum source contact 112.

In an aspect, a gate reliability of the bandgap tuneable p-GaN HEMT 100 is configured to be in a range of 0 V to about 81.6 V, and a drain sustainability of the bandgap tuneable p-GaN HEMT 100 is configured to be in a range of 0 V to about 131 V at $V_{GS}$ of about −1 V, where $V_{GS}$ is measured between the platinum gate contact 122 and the aluminum source contact 112.

A second embodiment describes a method 200 of making a bandgap tuneable p-GaN high electron mobility transistor (HEMT) 100, comprising: growing a silicon carbide (SiC) substrate 102 layer to a thickness of about 1.99 microns; depositing, by DC reactive magnetron sputtering, an indium nitride (InN) nucleation layer 104 on the SiC substrate 102 to a thickness of about 5 nanometers; growing, by chemical vapor deposition, an aluminum nitride (AlN) nucleation layer 106 on the InN nucleation layer 104 to a thickness of about 5 nanometers; depositing a first aluminum gallium nitride (AlGaN) buffer layer 108 on the AlN nucleation layer 106 to a thickness of about 2.64 microns, wherein the first AlGaN layer has an aluminum composition of about 51%; depositing a gallium nitride (GaN) channel layer 110 on the first AlGaN buffer layer 108 to a thickness of about 34 nanometers; depositing an aluminum source contact 112 over a first end 110a of the GaN channel layer 110, wherein the aluminum source contact 112 is configured to have a length of about 1 micron; depositing an aluminum drain contact 114 over a second end 110b of the GaN channel layer 110, wherein the aluminum drain contact 114 is configured to have a length of about 1 micron; depositing a two dimensional molybdenum disulfide ($MoS_2$) layer 116 over the GaN channel layer 110 between the aluminum source contact 112 and the aluminum drain contact 114 to a thickness of about 2 nanometers, and configuring a length of the two dimensional $MoS_2$ layer 116 to be about 0.65 microns; depositing a second AlGaN buffer layer 118 located over the two dimensional $MoS_2$ layer 116 between the aluminum source contact 112 and the aluminum drain contact 114, wherein the second AlGaN buffer layer 118 is configured to have a length of about 0.65 microns and a thickness of about 14.7 nanometers; depositing a p-type gallium nitride cap layer 120 on the second AlGaN buffer layer 118 at a distance of about 1 micron from the aluminum source contact 112 and about 6 microns from the aluminum drain contact 114, wherein the p-type gallium nitride cap layer 120 is configured to have a length of about 1.4 microns and a thickness of about 60 nanometers; doping the p-type gallium nitride cap layer 120 to a doping concentration of $10^{16}/cm^3$; and depositing a platinum gate contact 122 on the p-type gallium nitride cap layer 120.

In an aspect, the method 200 further comprises connecting an input voltage source to the aluminum source contact 112; connecting a gate bias voltage source to the platinum gate contact 122; connecting an output terminal to the aluminum drain contact 114; applying an input voltage in a range of about 4 V to about 8 V to the aluminum source contact 112; applying a gate bias to the platinum gate contact 122 in a range of about 4 V to about 10 V; and generating a peak saturation drain current $I_D$ in a range of about 0.49 A to about 0.73 A at the aluminum drain contact 114.

In an aspect, the method 200 further comprises depositing the two dimensional $MoS_2$ layer 116 in a first $MoS_2$ layer 116a having a thickness of about 1 nanometer and a second $MoS_2$ layer 116b having a thickness of about 1 nanometer.

The dimensions, measurements, and specific values provided in the description of the bandgap tuneable p-GaN HEMT 100 and its constituent layers are exemplary and should not be construed as limiting the scope of the present disclosure. These values, including but not limited to the thicknesses of the SiC substrate 102, the InN nucleation layer 104, the AlN nucleation layer 106, the first and second AlGaN buffer layers 108 and 118, the GaN channel layer 110, the two-dimensional $MoS_2$ layer 116, and the p-type gallium nitride cap layer 120, as well as the lengths of the aluminum source contact 112, the aluminum drain contact 114, and the platinum gate contact 122, are provided for illustrative purposes only. The same applies to the specified doping concentrations, aluminum compositions, voltage ranges, current values, power outputs, and temperature measurements. It is understood that these parameters may be varied based on specific application requirements, manufacturing processes, and technological advancements without departing from the spirit and scope of the invention. The present disclosure encompasses variations in these dimensions and values that achieve the described functionality and performance characteristics of the bandgap tuneable p-GaN HEMT 100.

Numerous modifications and variations of the present disclosure are possible in light of the above teachings. It is therefore to be understood that within the scope of the appended claims, the invention may be practiced otherwise than as specifically described herein.

The invention claimed is:

1. A bandgap tuneable p-GaN high electron mobility transistor (HEMT), comprising:
a silicon carbide (SiC) substrate;
an indium nitride (InN) nucleation layer deposited on the SiC substrate, wherein the InN nucleation layer has a thickness of about 5 nanometers;
an aluminum nitride (AlN) nucleation layer grown on the InN nucleation layer, wherein the AlN nucleation layer has a thickness of about 5 nanometers;
a first aluminum gallium nitride (AlGaN) buffer layer located on the AlN nucleation layer;
a gallium nitride (GaN) channel layer located on the first AlGaN buffer layer;
an aluminum source contact located over a first end of the GaN channel layer;
an aluminum drain contact located over a second end of the GaN channel layer;
a two dimensional molybdenum disulfide ($MoS_2$) layer located over the GaN channel layer between the aluminum source contact and the aluminum drain contact, wherein the two dimensional $MoS_2$ layer has a thickness of about 2 nanometers;
a second aluminum gallium nitride (AlGaN) buffer layer located over the two dimensional $MoS_2$ layer between the aluminum source contact and the aluminum drain contact;
a p-type gallium nitride cap layer located on the second AlGaN buffer layer at a distance of about 1 micron from the aluminum source contact and about 6 microns from the aluminum drain contact; and
a platinum gate contact located on the p-type gallium nitride cap layer.

2. The bandgap tuneable p-GaN HEMT of claim 1, wherein:
the SiC substrate layer has a thickness of about 1.99 microns;
the first AlGaN buffer layer has a thickness of about 2.64 microns and an aluminum composition of about 51%;
the GaN channel layer has a thickness of about 34 nanometers;
the aluminum source contact has a length of about 1 micron;
the aluminum drain contact has a length of about 1 micron;
the two dimensional $MoS_2$ layer has a length of about 0.65 microns;
the second AlGaN buffer layer has a length of about 0.65 microns and a thickness of about 14.7 nanometers;
the p-type gallium nitride cap layer has a length of about 1.4 microns and a thickness of about 60 nanometers; and
the platinum gate contact has a length of about 1.4 microns.

3. The bandgap tuneable p-GaN HEMT of claim 2, wherein the two dimensional $MoS_2$ layer is configured to increase the bandgap under compressive strain and to decrease the bandgap under tensile strain.

4. The bandgap tuneable p-GaN HEMT of claim 2, wherein the p-type gallium nitride cap layer has a doping concentration of $10^{16}/cm^{-3}$.

5. The bandgap tuneable p-GaN HEMT of claim 2, wherein the two dimensional $MoS_2$ layer comprises a first $MoS_2$ layer having a thickness of about 1 nanometer and a second $MoS_2$ layer having a thickness of about 1 nanometer.

6. The bandgap tuneable p-GaN HEMT of claim 2, wherein the indium nitride (InN) nucleation layer is deposited on the SiC substrate using DC reactive magnetron sputtering.

7. The bandgap tuneable p-GaN HEMT of claim 2, wherein the aluminum nitride nucleation layer is grown on the indium nitride (InN) nucleation layer by chemical vapor deposition.

8. The bandgap tuneable p-GaN HEMT of claim 2, wherein the bandgap tuneable p-GaN HEMT is configured to have a maximum global device temperature of about 369 degrees Kelvin for an applied operating voltage $V_{DS}$ of about 8 V and an applied gate bias $V_{GS}$ of about 10 V, where $V_{DS}$ is measured between the aluminum drain contact and the aluminum source contact and where $V_{GS}$ is measured between the platinum gate contact and the aluminum source contact.

9. The bandgap tuneable p-GaN HEMT of claim 2, wherein the bandgap tuneable p-GaN HEMT is configured to have a maximum global device temperature within a range of about 320 degrees Kelvin to about 369 degrees Kelvin for an applied operating voltage $V_{DS}$ in a range of about 4 V to about 8 V and an applied gate bias $V_{GS}$ in a range of about 4 V to about 10 V, where $V_{DS}$ is measured between the aluminum drain contact and the aluminum source contact and where $V_{GS}$ is measured between the platinum gate contact and the aluminum source contact.

10. The bandgap tuneable p-GaN HEMT of claim 2, wherein the bandgap tuneable p-GaN HEMT is configured to have a peak saturation drain current $I_D$ in a range of about 0.49 A to about 0.73 A for an applied operating voltage $V_{DS}$ in a range of about 4 V to about 8 V and an applied gate bias $V_{GS}$ of about 10 V, where $V_{DS}$ is measured between the aluminum drain contact and the aluminum source contact, $V_{GS}$ is measured between the platinum gate contact and the aluminum source contact and $I_D$ is measured at the aluminum drain contact.

11. The bandgap tuneable p-GaN HEMT of claim 2, wherein the gallium nitride (GaN) channel layer is configured to have an electron mobility in a range of 800 $cm^2/V$ seconds to about 2000 $cm^2/V$ seconds.

12. The bandgap tuneable p-GaN HEMT of claim 2, wherein the bandgap tuneable p-GaN HEMT is configured to have an ON current of about 0.73 A and an OFF current of about $-2.14 \times 10^{-7}$ A for an applied operating voltage $V_{DS}$=8 V, where $V_{DS}$ is measured between the aluminum drain contact and the aluminum source contact.

13. The bandgap tuneable p-GaN HEMT of claim 2, wherein the bandgap tuneable p-GaN HEMT is configured to have an ON resistance of about 20.18 ohms and an off resistance of about $-7.8 \times 10^{-6}$ ohms.

14. The bandgap tuneable p-GaN HEMT of claim 2, wherein the bandgap tuneable p-GaN HEMT is configured to have a threshold voltage of about 0.85 V for an applied operating voltage $V_{DS}$ of about 4 V, where $V_{DS}$ is measured between the aluminum drain contact and the aluminum source contact.

15. The bandgap tuneable p-GaN HEMT of claim 2, wherein the bandgap tuneable p-GaN HEMT is configured to generate an output power of about 7.3 W at an applied operating voltage $V_{DS}$ of about 8 V and an applied gate bias $V_{GS}$ of about 10 V, where $V_{DS}$ is measured between the aluminum drain contact and the aluminum source contact and $V_{GS}$ is measured between the platinum gate contact and the aluminum source contact.

16. The bandgap tuneable p-GaN HEMT of claim 2, wherein the bandgap tuneable p-GaN HEMT is configured to have a linear relationship of output power versus applied gate bias $V_{GS}$ in a range of about 4 V to about 10 V, where $V_{GS}$ is measured between the platinum gate contact and the aluminum source contact.

17. The bandgap tuneable p-GaN HEMT of claim 2, wherein a gate reliability of the bandgap tuneable p-GaN HEMT is configured to be in a range of 0 V to about 81.6 V, and a drain sustainability of the bandgap tuneable p-GaN HEMT is configured to be in a range of 0 V to about 131 V at $V_{GS}$ of about $-1$ V, where $V_{GS}$ is measured between the platinum gate contact and the aluminum source contact.

18. A method of making a bandgap tuneable p-GaN high electron mobility transistor (HEMT), comprising:
   growing a silicon carbide (SiC) substrate layer to a thickness of about 1.99 microns;
   depositing, by DC reactive magnetron sputtering, an indium nitride (InN) nucleation layer on the SiC substrate to a thickness of about 5 nanometers;
   growing, by chemical vapor deposition, an aluminum nitride (AlN) nucleation layer on the InN nucleation layer to a thickness of about 5 nanometers;
   depositing a first aluminum gallium nitride (AlGaN) buffer layer on the AlN nucleation layer to a thickness of about 2.64 microns, wherein the first AlGaN layer has an aluminum composition of about 51%;
   depositing a gallium nitride (GaN) channel layer on the first AlGaN buffer layer to a thickness of about 34 nanometers;
   depositing an aluminum source contact over a first end of the GaN channel layer, wherein the aluminum source contact is configured to have a length of about 1 micron;
   depositing an aluminum drain contact over a second end of the GaN channel layer, wherein the aluminum drain contact is configured to have a length of about 1 micron;
   depositing a two dimensional molybdenum disulfide ($MoS_2$) layer over the GaN channel layer between the aluminum source contact and the aluminum drain contact to a thickness of about 2 nanometers, and configuring a length of the two dimensional $MoS_2$ layer to be about 0.65 microns;
   depositing a second AlGaN buffer layer located over the two dimensional $MoS_2$ layer between the aluminum source contact and the aluminum drain contact, wherein the second AlGaN buffer layer is configured to have a length of about 0.65 microns and a thickness of about 14.7 nanometers;
   depositing a p-type gallium nitride cap layer on the second AlGaN buffer layer at a distance of about 1 micron from the aluminum source contact and about 6 microns from the aluminum drain contact, wherein the p-type gallium nitride cap layer is configured to have a length of about 1.4 microns and a thickness of about 60 nanometers;
   doping the p-type gallium nitride cap layer to a doping concentration of $10^{16}/cm^{-3}$; and
   depositing a platinum gate contact on the p-type gallium nitride cap layer.

19. The method of claim 18, further comprising:
   connecting an input voltage source to the aluminum source contact;
   connecting a gate bias voltage source to the platinum gate contact;
   connecting an output terminal to the aluminum drain contact;
   applying an input voltage in a range of about 4 V to about 8 V to the aluminum source contact;
   applying a gate bias to the platinum gate contact in a range of about 4 V to about 10 V; and
   generating a peak saturation drain current $I_D$ in a range of about 0.49 A to about 0.73 A at the aluminum drain contact.

20. The method of claim 18, further comprising:
   depositing the two dimensional $MoS_2$ layer in a first $MoS_2$ layer having a thickness of about 1 nanometer and a second $MoS_2$ layer having a thickness of about 1 nanometer.

* * * * *

UNITED STATES PATENT AND TRADEMARK OFFICE
CERTIFICATE OF CORRECTION

PATENT NO. : 12,243,928 B1
APPLICATION NO. : 18/916467
DATED : March 4, 2025
INVENTOR(S) : Ghada A. Khouqeer et al.

Page 1 of 1

It is certified that error appears in the above-identified patent and that said Letters Patent is hereby corrected as shown below:

On the Title Page

Item (72), the city/country of the inventors should read:
Inventors: Ghada A. Khouqeer, Riyadh (SA); Arihant Raj Siddarth, Dehradun (IN); Gaurav Jayaswal, Bangalore (IN); Rahul Sharma, Mohali (IN); Yogita Sharma, Ahmedabad (IN); Priya Kaushal, Hamirpur (IN); Gargi Khanna, Hamirpur (IN); Tahani A. Alrebdi, Riyadh (SA); Abdullah N. Alodhayb, Riyadh (SA)

Signed and Sealed this
Twenty-ninth Day of July, 2025

Coke Morgan Stewart
*Acting Director of the United States Patent and Trademark Office*